(12) United States Patent
Tsai et al.

(10) Patent No.: US 11,251,181 B2
(45) Date of Patent: Feb. 15, 2022

(54) FINFET ISOLATION STRUCTURE AND METHOD FOR FABRICATING THE SAME

(71) Applicant: Taiwan Semiconductor Manufacturing Co., Ltd., Hsinchu (TW)

(72) Inventors: Wen-Che Tsai, Hsinchu (TW); Min-Yann Hsieh, Kaohsiung (TW); Hua Feng Chen, Hsinchu (TW); Kuo-Hua Pan, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 43 days.

(21) Appl. No.: 16/715,032

(22) Filed: Dec. 16, 2019

(65) Prior Publication Data

US 2020/0119007 A1   Apr. 16, 2020

Related U.S. Application Data

(62) Division of application No. 15/686,860, filed on Aug. 25, 2017, now Pat. No. 10,510,751.

(51) Int. Cl.
*H01L 27/088* (2006.01)
*H01L 29/45* (2006.01)
(Continued)

(52) U.S. Cl.
CPC .... *H01L 27/0886* (2013.01); *H01L 21/31116* (2013.01); *H01L 21/764* (2013.01);
(Continued)

(58) Field of Classification Search
CPC ....... H01L 21/823475; H01L 21/76877; H01L 21/764; H01L 29/0649; H01L 21/7682; H01L 29/515; H01L 21/76882
See application file for complete search history.

(56) References Cited

U.S. PATENT DOCUMENTS 6,335,249 B1   1/2002   Thei et al.
8,466,012 B1   6/2013   Chang et al.
(Continued)

FOREIGN PATENT DOCUMENTS

| KR | 20140119020 | 10/2014 |
|---|---|---|
| KR | 20160100228 | 8/2016 |
| KR | 20160116215 | 10/2016 |

*Primary Examiner* — John A Bodnar
(74) *Attorney, Agent, or Firm* — Haynes and Boone, LLP

(57) ABSTRACT

Embodiments of the disclosure provide a semiconductor device including a substrate, an insulating layer formed over the substrate, a plurality of fins formed vertically from a surface of the substrate, the fins extending through the insulating layer and above a top surface of the insulating layer, a gate structure formed over a portion of fins and over the top surface of the insulating layer, a source/drain structure disposed adjacent to opposing sides of the gate structure, the source/drain structure contacting the fin, a dielectric layer formed over the insulating layer, a first contact trench extending a first depth through the dielectric layer to expose the source/drain structure, the first contact trench containing an electrical conductive material, and a second contact trench extending a second depth into the dielectric layer, the second contact trench containing the electrical conductive material, and the second depth is greater than the first depth.

20 Claims, 13 Drawing Sheets

(51) Int. Cl.

| | |
|---|---|
| *H01L 29/06* | (2006.01) |
| *H01L 21/8234* | (2006.01) |
| *H01L 21/768* | (2006.01) |
| *H01L 21/764* | (2006.01) |
| *H01L 21/762* | (2006.01) |
| *H01L 21/311* | (2006.01) |
| *H01L 29/66* | (2006.01) |
| *H01L 21/8238* | (2006.01) |
| *H01L 29/786* | (2006.01) |
| *H01L 27/092* | (2006.01) |
| *H01L 21/306* | (2006.01) |
| *H01L 21/308* | (2006.01) |
| *H01L 29/08* | (2006.01) |

(52) U.S. Cl.
CPC .. *H01L 21/76224* (2013.01); *H01L 21/76802* (2013.01); *H01L 21/76877* (2013.01); *H01L 21/76882* (2013.01); *H01L 21/823431* (2013.01); *H01L 21/823475* (2013.01); *H01L 21/823481* (2013.01); *H01L 21/823821* (2013.01); *H01L 27/0924* (2013.01); *H01L 29/0649* (2013.01); *H01L 29/45* (2013.01); *H01L 29/66795* (2013.01); *H01L 29/78651* (2013.01); *H01L 21/3081* (2013.01); *H01L 21/3086* (2013.01); *H01L 21/30625* (2013.01); *H01L 21/823418* (2013.01); *H01L 21/823437* (2013.01); *H01L 29/0847* (2013.01)

(56) References Cited

U.S. PATENT DOCUMENTS

| | | | |
|---|---|---|---|
| 9,082,852 | B1 | 7/2015 | Liu et al. |
| 2003/0037880 | A1* | 2/2003 | Carducci ............ H01L 21/76897 |
| | | | 156/345.43 |
| 2003/0181032 | A1* | 9/2003 | Kawano ............ H01L 21/76877 |
| | | | 438/633 |
| 2008/0048262 | A1 | 2/2008 | Lee et al. |
| 2009/0230439 | A1 | 9/2009 | Wang et al. |
| 2012/0193698 | A1 | 8/2012 | Noda et al. |
| 2014/0159142 | A1 | 6/2014 | Lim et al. |
| 2014/0191312 | A1* | 7/2014 | Kim ................... H01L 29/4966 |
| | | | 257/330 |
| 2016/0043222 | A1 | 2/2016 | Cho et al. |
| 2016/0079162 | A1 | 3/2016 | Hsieh et al. |
| 2016/0336235 | A1 | 11/2016 | Cheng et al. |
| 2017/0125530 | A1 | 5/2017 | Zhang et al. |
| 2017/0154968 | A1* | 6/2017 | Park .................... H01L 27/0924 |
| 2019/0067276 | A1 | 2/2019 | Tsai et al. |

* cited by examiner

FINFET ISOLATION STRUCTURE AND METHOD FOR FABRICATING THE SAME

PRIORITY DATA

The present application is a divisional application of U.S. patent application Ser. No. 15/686,860, field Aug. 25, 2017, which is hereby incorporated by reference in its entirety.

BACKGROUND

As the semiconductor industry has progressed into nanometer technology process nodes in pursuit of higher device density and better performance, three-dimensional designs, such as fin field effect transistor (FinFET) devices, have been introduced into many logic and applications. One type of FinFET device is fabricated with multiple fin-like structures expanding vertically from a surface of a substrate. These fin-like structures are separated from each other by a shallow trench isolation (STI) region. Each of the fin-like structure has source/drain regions and a channel region formed between the source and drain regions. A metal gate is wrapped around the channel region of each fin-like structure, allowing better control of current flow from three sides of the channel region.

An issue associated with the above FinFET device is that the depth of trenches for forming source/drain contacts (electrically coupled to the source/drain regions for interlayer connection) at the STI region and the depth of trenches for forming source/drain contacts at the active region that includes the source/drain regions and the channel regions are different due to pattern-loading effects, which would occur when there is a difference in pattern densities between the STI region and the active region. Such a difference in depth may cause distortion of the trench profile after the trenches are filled with a conductive material. As a result, the performance of the device is degraded.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
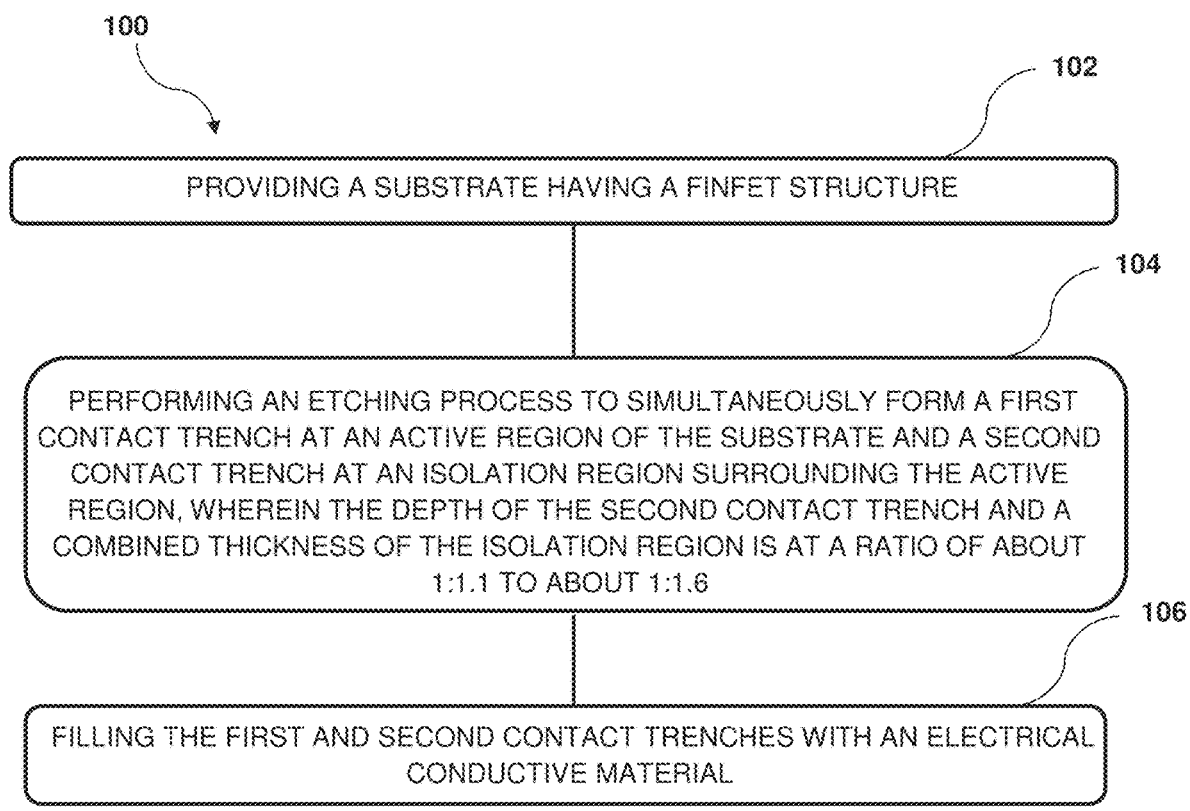
FIG. 1 is a flow chart illustrating an exemplary method for fabricating a semiconductor device according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2A:
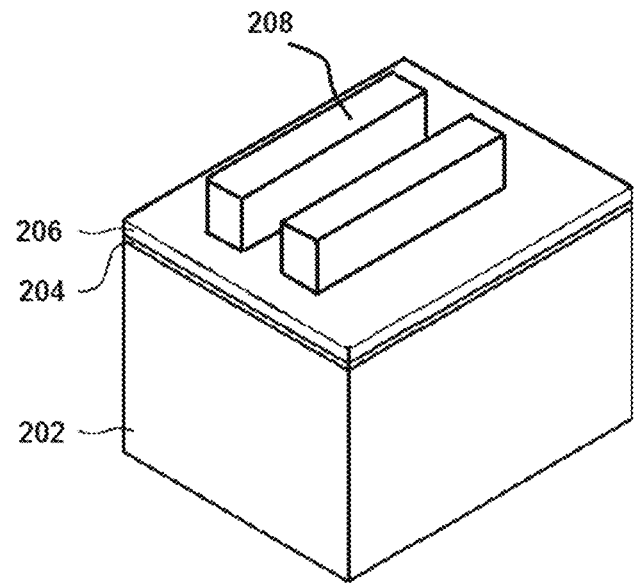
FIGS. 2A to 2P illustrate cross-sectional views of the semiconductor device at various stages of fabrication according to the flow chart of FIG. 1.

FIG. 1 is a flow chart 100 illustrating an exemplary method for fabricating a semiconductor device according to various embodiments of the present disclosure. FIGS. 2A to 2P illustrate cross-sectional views of the semiconductor device at various stages of fabrication according to the flow chart of FIG. 1. Those skilled in the art should recognize that the full process for forming a semiconductor device and the associated structures are not illustrated in the drawings or described herein. Although various operations are illustrated in the drawings and described herein, no limitation regarding the order of such steps or the presence or absence of intervening steps is implied. Operations depicted or described as sequential are, unless explicitly specified, merely done so for purposes of explanation without precluding the possibility that the respective steps are actually performed in concurrent or overlapping manner, at least partially if not entirely.

The flow chart 100 begins at operation 102 by providing a substrate 202, as shown in FIG. 2A. The substrate 202 may be a semiconductor wafer such as a silicon wafer. Alternatively or additionally, substrate 202 may include elementary semiconductor materials, compound semiconductor materials, and/or alloy semiconductor materials. Examples of the elementary semiconductor materials may include, but are not limited to, crystal silicon, polycrystalline silicon, amorphous silicon, and/or germanium. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

A dielectric layer 204 and a mask layer 206 are formed over substrate 202, and a photo-sensitive layer 208 is formed over the mask layer 206, as shown in FIG. 2A in accordance with some embodiments. FIG. 2A shows the photo-sensitive layer 208 has been patterned. Dielectric layer 204 may be used as an adhesion layer between substrate 202 and the mask layer 206. In addition, dielectric layer 204 may also be used as an etch stop layer for etching the mask layer 206. In some embodiments, the dielectric layer 204 is made of silicon oxide. The dielectric layer 204 may be formed by using a thermal oxidation process, although other deposition processes may be used in some other embodiments.

The mask layer 206 may be used as a hard mask during subsequent photolithography processes. In some embodiments, the mask layer 206 is made of silicon nitride. The mask layer 206 may be formed by using low-pressure chemical vapor deposition (LPCVD) or plasma enhanced chemical vapor deposition (PECVD), although other deposition processes may also be used in some other embodiments.

Figure 2B:
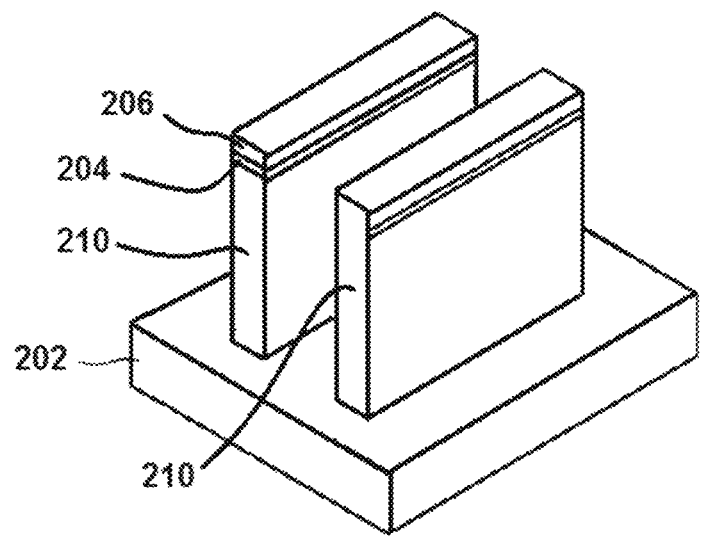
Figure 2C:
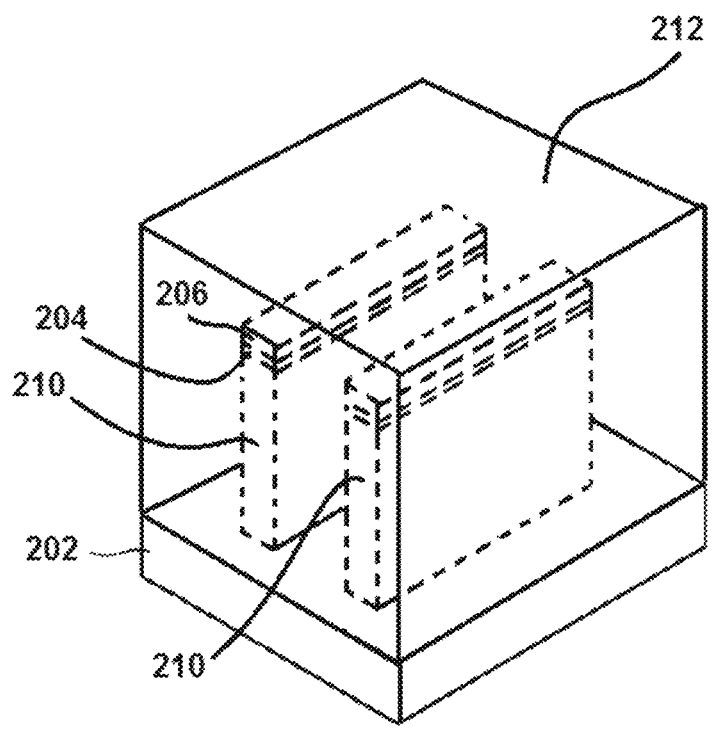

Next, fins 210 are formed by sequentially etching the mask layer 206, the dielectric layer 204, and a portion of the substrate 202 through the photo-sensitive layer 208, as shown in FIG. 2B in accordance with some embodiments. The fins 210 are a portion of the substrate 202. The photo-sensitive layer 208 is then removed. After the photo-sensitive layer 208 has been removed, an insulating layer 212 is formed to cover the fins 210 over the substrate 202, as shown in FIG. 2C in accordance with some embodiments. The insulating layer 212 may be shallow trench isolation (STI) structures. The insulating layer 212 may be made of silicon oxide, silicon nitride, silicon oxynitride, fluoride-doped silicate glass (FSG), or other low-K dielectric materials that has a dielectric constant of less than about 3.9, for example about 3.2 or less. In one embodiment, the insulating layer 212 is silicon oxide. The insulating layer 212 may be formed using high-density plasma (HDP), sub-atmospheric pressure chemical vapor deposition (SACVD), low-pressure chemical vapor deposition (LPCVD), atomic layer deposition (ALD), plasma enhanced ALD (PEALD), plasma enhanced CVD (PECVD), monolayer deposition (MLD), plasma impulse CVD (PICVD), spin-on deposition, or the like.

Figure 2D:
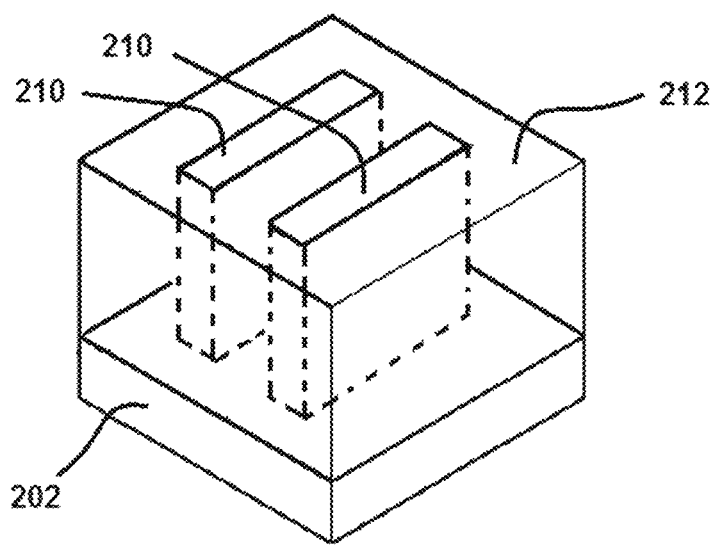

After the insulating layer 212 has been formed, a chemical mechanical polishing (CMP) process may be performed to expose the top surfaces of fins 210, as shown in FIG. 2D in accordance with some embodiments. As shown in FIG. 2D, the mask layer 206 and the dielectric layer 204 have been removed.

Figure 2E:
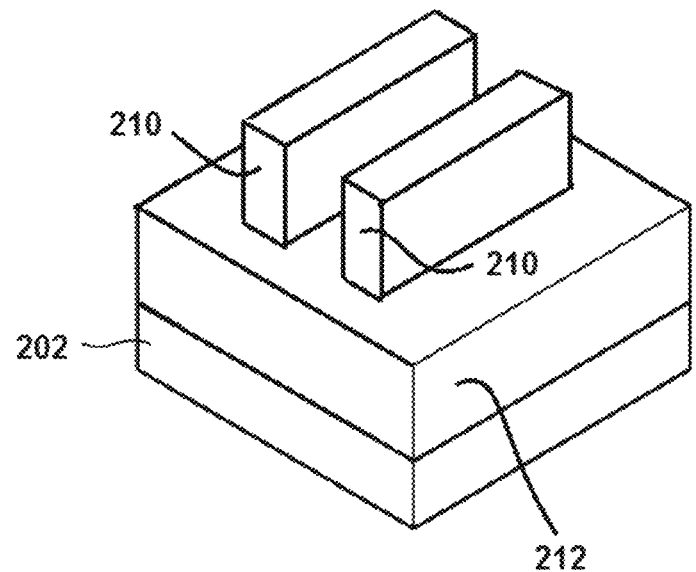

Next, the insulating layer 212 is recessed to expose the top portion of fins 210, as shown in FIG. 2E in accordance with some embodiments. The insulating layer 212 may be recessed by a wet etching process or a dry etching process. As discussed above, the insulating layer 212 may be seen as shallow trench isolation (STI) structures surrounding the fins 210. The insulating layer 212 defines an isolation region of the substrate 200.

Figure 2F:
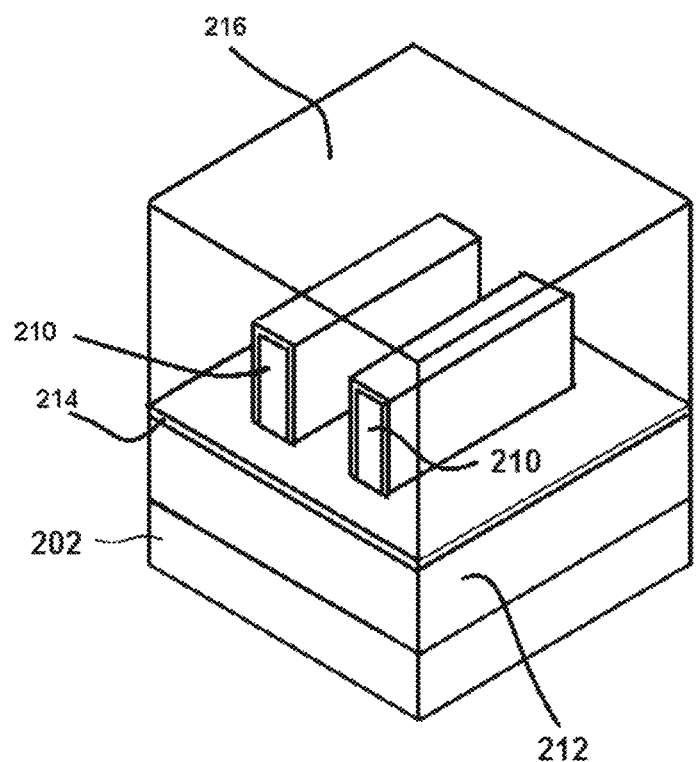

Thereafter, a gate dielectric 214 is formed over the substrate 202 to cover the fins 210 and the insulating layer 212, as shown in FIG. 2F in accordance with some embodiments. The gate dielectric layer 214 may be made of high-k dielectric materials, such as metal oxides, transition metal-oxides, or the like. Examples of the high-k dielectric material may include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the gate dielectric layer 214 is an oxide layer. The gate dielectric layer 214 may be formed by a deposition processes, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

After the gate dielectric layer 214 is formed, a sacrificial layer 216 is formed over the gate dielectric layer 214, as shown in FIG. 2F in accordance with some embodiments. The sacrificial layer 216 may be formed by a deposition processes, such as chemical vapor deposition (CVD), physical vapor deposition (PVD), atomic layer deposition (ALD), high density plasma CVD (HDPCVD), metal organic CVD (MOCVD), or plasma enhanced CVD (PECVD). The sacrificial layer 216 may be made of conductive or non-conductive materials, such as metals, silicon containing materials, or dielectric materials. In some embodiments, the sacrificial layer 216 is made of polysilicon.

Figure 2G:
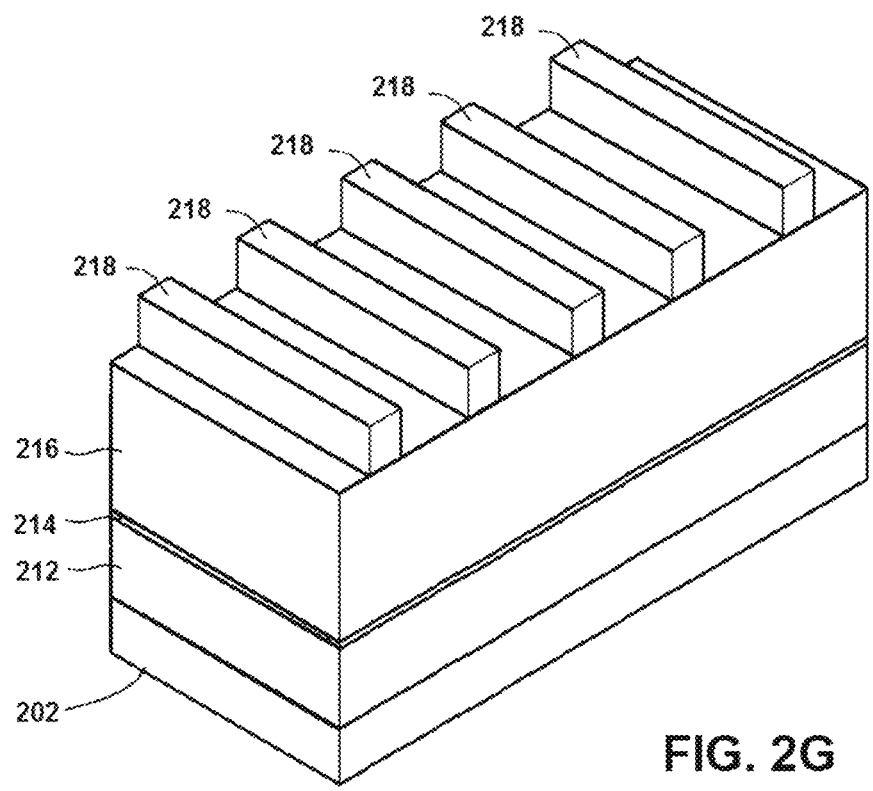

Next, a plurality of mask structures 218 is formed over a portion of the sacrificial layer 216, as shown in FIG. 2G. The mask structures 218 may be seen as a hard mask for protecting the sacrificial layer 216 and the gate dielectric layer 214 formed underneath during subsequent photolithography processes. The mask structures 218 may be formed by a procedure including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Figure 2H:
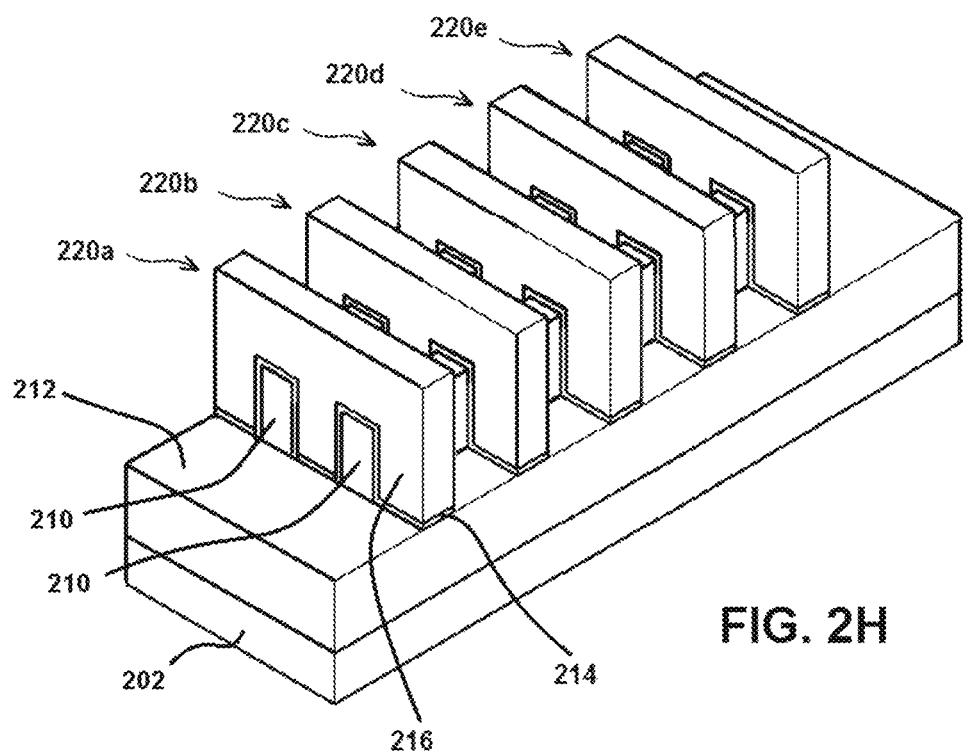
Figure 2I:
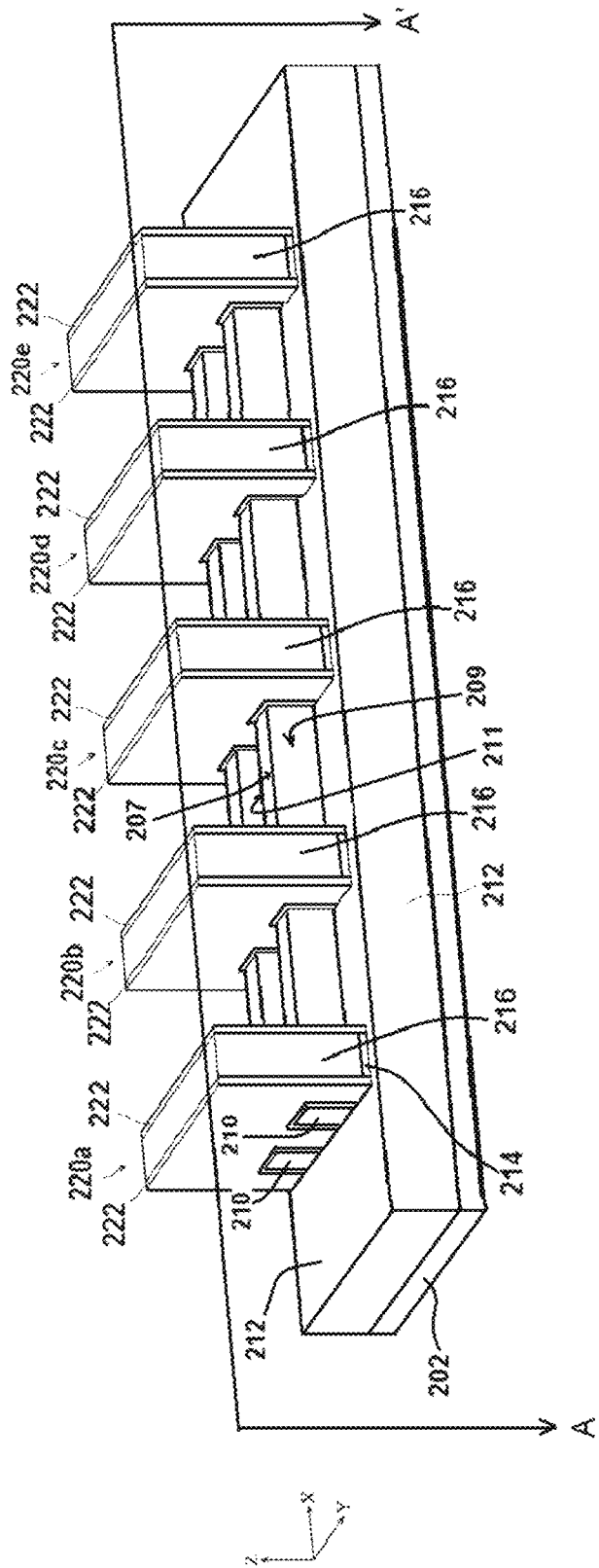

After the mask structures 218 have been formed, the sacrificial layer 216 and gate dielectric layer 214 are patterned using an etching process to form a plurality of gate structures 220a-220e in accordance with some embodiments, as shown in FIG. 2H. By performing the etching process, the portions of the sacrificial layer 216 and the gate dielectric layer 214 that are not covered by the mask structure 218 are removed. The mask structures 218 are then removed using any suitable process such as an ashing or etch process. The gate structures 220a-220e may be considered to include portions of the sacrificial layer 216 and the gate dielectric layer 214 positioned below the mask structure 218. As shown in FIG. 2I below, the resulting gate structures 220a-220e are formed over a portion of the fins 210, wrapping around the top surface 207 and opposing sides 209, 211 of the fins 210. The gate structures 220a-220e are separated from and parallel to each other.

It is understood that two fins and five gate structures are shown for illustration purposes only. The fins and gate structures may be in any numbers as needed depending on the application. In addition, while the gate structures 220a-220e discussed herein are fabricated using a gate-last process, it is contemplated that the gate structures may be fabricated using a gate-first process as understood by those skilled artisan in the art.

After the gate structures 220a-220e have been formed, spacers 222 are formed on the sidewalls of the gate structures 220a-220e, as shown in FIG. 2I in accordance with some embodiments. In some embodiments, the spacers 222 are made of silicon nitride, silicon carbide, silicon oxynitride, silicon carbon, silicon oxide, silicon hydrogen, other applicable materials, or a combination thereof. In some embodiments, the spacers 222 are made of nitride. Spacers 222 may be formed by deposition and etching processes.

As described previously, the portions of gate dielectric layer 214 formed over the fins 210 and the insulating layer 212 not covered by the mask structures 218 may be removed by the etching process in accordance with some embodiments. Therefore, when spacers 222 are formed on the fins 210 and the insulating layer 212 at the sidewalls of the gate structures 220a-220e, the spacers 222 are in direct contact with the fins 210 and the insulating layer 212. That is, no gate dielectric layer 214 is positioned between the spacers 222 and the fins 210.

Figure 2J:
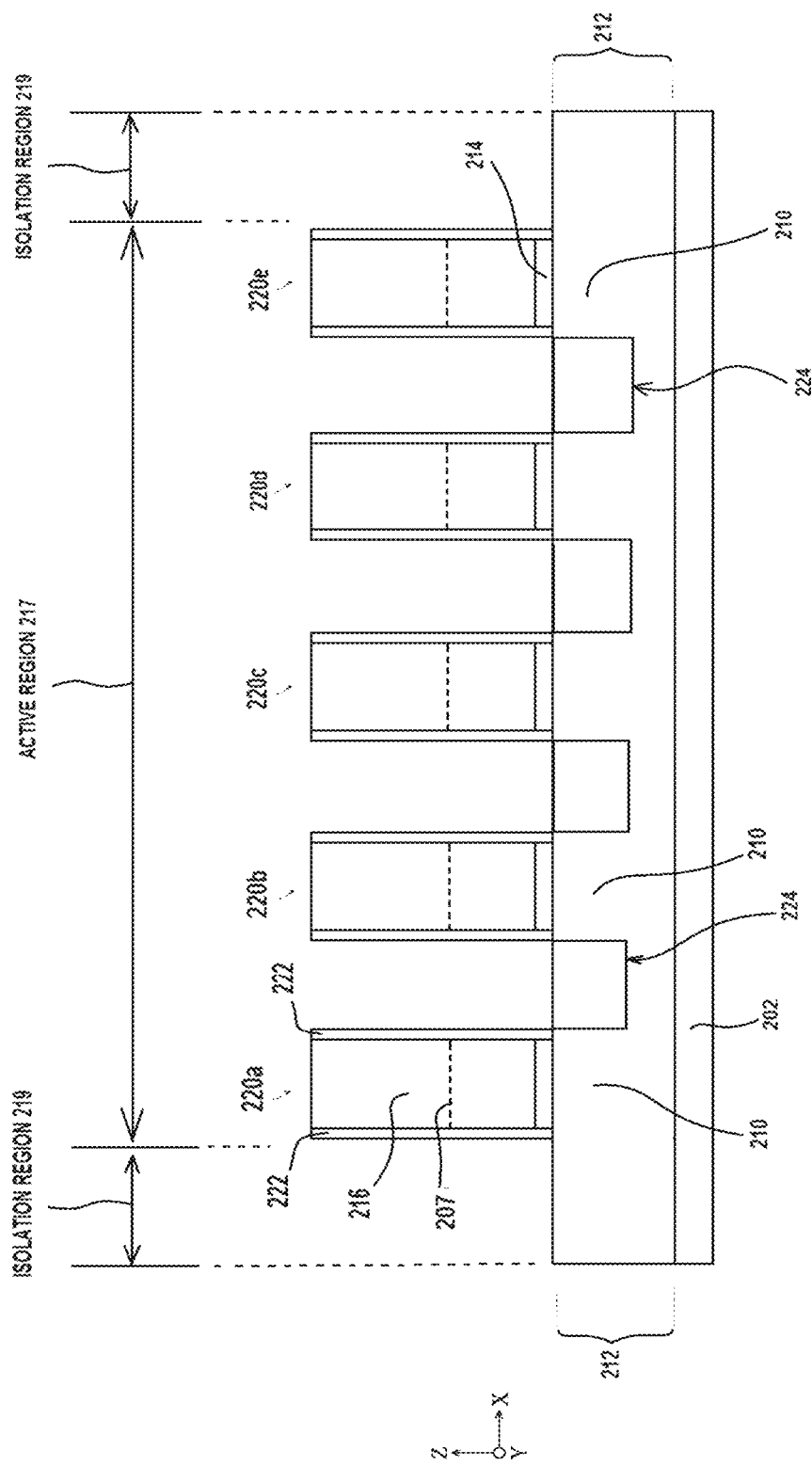

Next, portions of the fins 210 (other than where the gate structures 220a-220e are formed thereover) are recessed using an etch process to form source and drain (S/D) trenches 224, as shown in FIG. 2J, which illustrates a cross-sectional view of the structure shown in FIG. 2I taken along line A-A'. The S/D trenches 224 (represented by solid lines) are adjacent to the opposing sides of each of the gate structures 220*b*, 220*c*, and 220*d*, while the insulating layer 212 (i.e., the STI regions), when viewed along the X-axis, remains on both sides of the fins 210 inside the S/D trenches 224. The exposed portion of the fins 210 and fins 210 between the S/D trenches 224 (covered by the gate structures 220*a*-220*e*) define an active region 217 for the substrate 202. The active region 217 is adjacent to or abuts the isolation region 210 (i.e., shallow trench isolation (STI) regions). In one embodiment, the active region 217 is encompassed or surrounded by isolation regions 219.

Figure 2K:
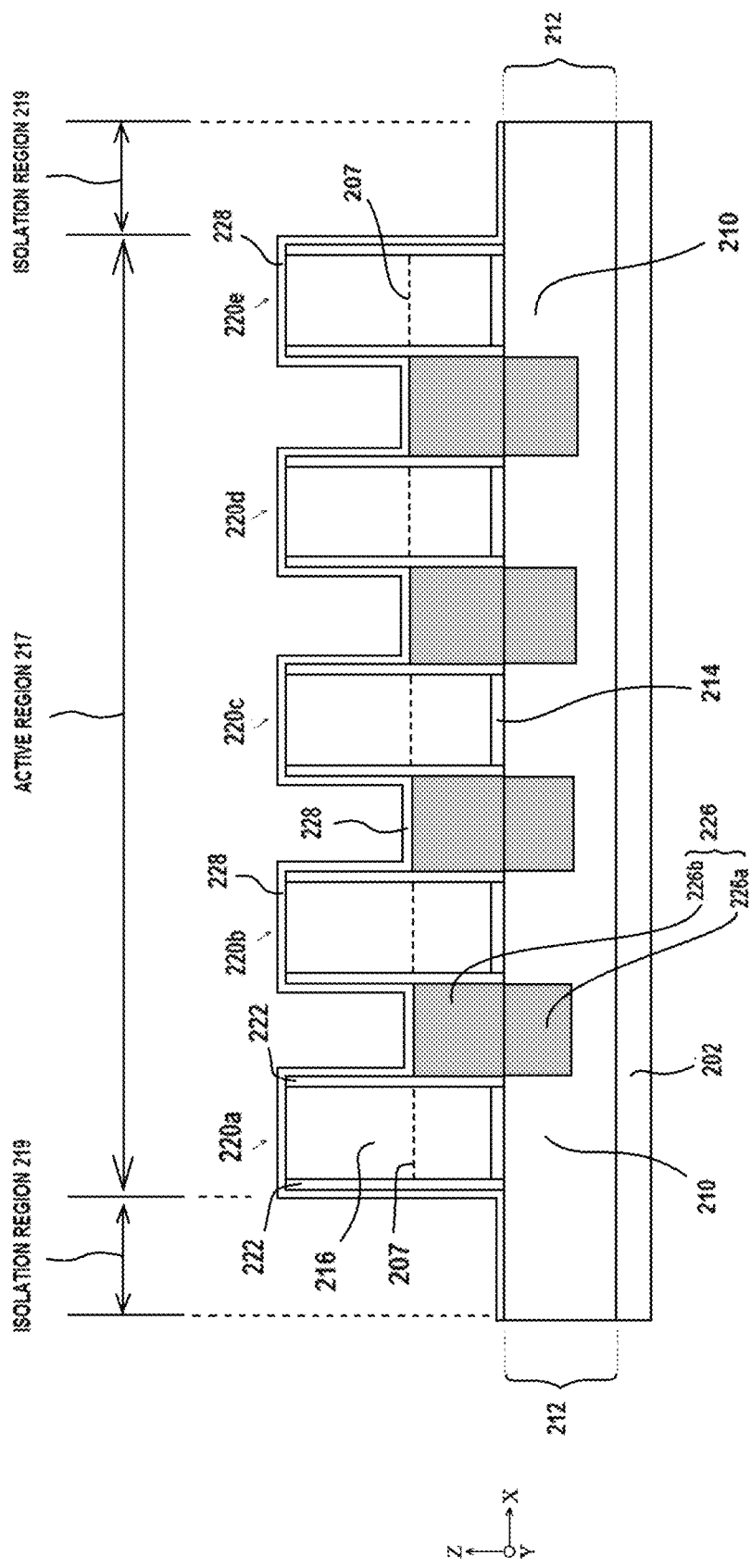

After the S/D trenches 224 have been formed in the fins 210, source/drain (S/D) structures 226 are formed in the S/D trenches 224, as shown in FIG. 2K in accordance with some embodiments. FIGS. 2K and 2L-2P to be discussed below are schematic cross-sectional views of the structure shown in FIG. 2I taken along line A-A' with various additional features. The S/D structures 226 can be seen to include a bottom portion 226*a* (disposed between the insulating layers 212 within the S/D trenches 224) and a top portion 226*b* (disposed outside the S/D trenches 224), when viewed along the X-axis. The fins 210 connected between the S/D structures 226 form a channel region (not shown) for the semiconductor device. It is understood that the S/D structures 226 outside the S/D trenches 224 (i.e., the top portion 226*b*) may have a different shape, depending on the material of the S/D structures 226 and/or the surface of the substrate 202 to be grown on. For example, the top portion 226*b* of the S/D structures 226 may grow epitaxially and expand horizontally to form facets. The facets may be formed with various profiles, for example a diamond-shaped cross-section profile when viewed along the X-axis, due to the differences in the growth rate on different planes (or surfaces) of the substrate.

Example materials for the S/D structures 226 may include, but are not limited to, germanium (Ge), silicon (Si), gallium arsenide (GaAs), aluminum gallium arsenide (AlGaAs), silicon germanium (SiGe), gallium arsenide phosphide (GaAsP), gallium antimony (GaSb), indium antimony (InSb), indium gallium arsenide (InGaAs), indium arsenide (InAs), or a combination thereof. The S/D structures 226 may be doped with a p-type dopant for forming a p-type FinFET or an n-type dopant for forming an n-type FinFET. The S/D structures 226 may be formed by epitaxial growing processes, such as CVD deposition techniques (e.g., vapor-phase epitaxy (VPE) and/or ultra-high vacuum CVD (UHV-CVD)), molecular beam epitaxy, and/or other suitable processes.

After S/D structures 226 have been formed, a contact etch stop layer (CESL) 228 is formed to cover exposed surfaces of the substrate 202, which may include the gate structures 220*a*-220*e*, the sidewall spacers 222, the S/D structures 226, and the exposed surfaces of the insulating layer 212, as shown in FIG. 2K in accordance with some embodiments. The contact etch stop layer 228 may be made of silicon nitride, silicon oxide, silicon oxynitride, silicon carbide, silicon carbonitride, boron nitride, silicon boron nitride, silicon carbon boron nitride, a combination thereof, and/or other applicable materials. In one embodiment, the contact etch stop layer 228 is silicon nitride. The contact etch stop layer 228 may be formed using any suitable technique, such as chemical vapor deposition (CVD), plasma enhanced chemical vapor deposition (PECVD), high-density plasma CVD (HCP-CVD), or spin-on coating process, etc.

Figure 2L:
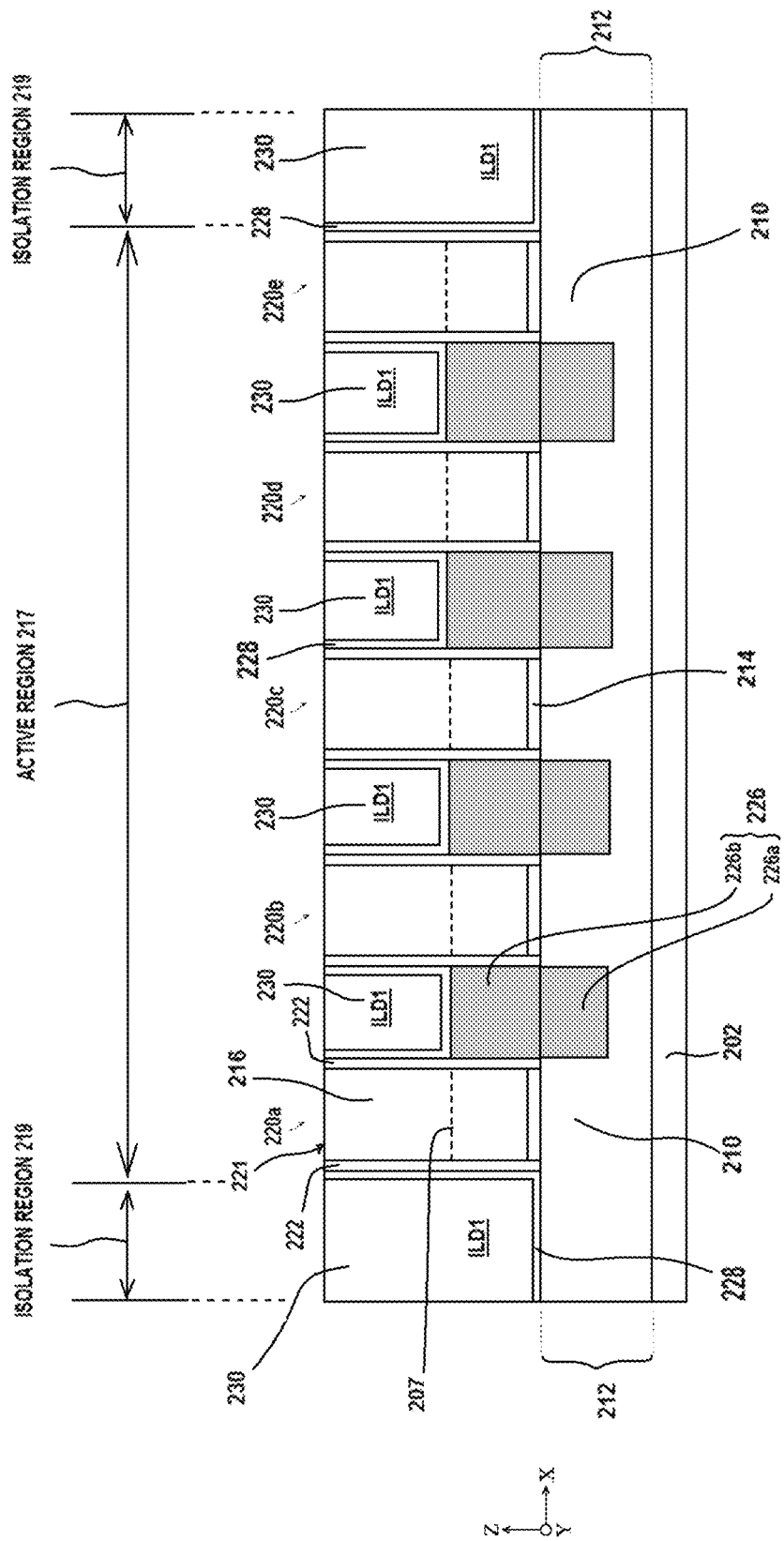

Thereafter, a first inter-layer dielectric (labeled as ILD1) layer 230 is formed over the contact etch stop layer 228 over the substrate 202, as shown in FIG. 2L in accordance with some embodiments. The first inter-layer dielectric layer 230 can be seen to laterally cross the active region 217 and the isolation region 219. The first inter-layer dielectric layer 230 may include multilayers made of multiple dielectric materials, such as silicon oxide, silicon nitride, silicon oxynitride, silicon carbide, silicon boron nitride (SiBN), silicon carbon boron nitride (SiCBN), tetraethoxysilane (TEOS), phosphosilicate glass (PSG), borophosphosilicate glass (BPSG), low-k dielectric material, and/or other applicable low-k dielectric materials. Examples of low-k dielectric materials may include, but are not limited to, fluorinated silica glass (FSG), carbon doped silicon oxide, amorphous fluorinated carbon, parylene, bis-benzocyclobutenes (BOB), or polyimide. The first inter-layer dielectric layer 230 may be formed by chemical vapor deposition (CVD), physical vapor deposition, (PVD), atomic layer deposition (ALD), spin-on coating, or other applicable processes.

After the first inter-layer dielectric (ILD) layer 230 has been formed, a planarization process is performed onto the first inter-layer dielectric layer 230, as shown in FIG. 2L in accordance with some embodiments. The inter-layer dielectric layer 230 may be planarized by a chemical mechanical polishing (CMP) process until the top surface 221 of gate structures 220*a*-220*e* is exposed, as shown in FIG. 2L. The top surface of the inter-layer dielectric layer 230 is substantially coplanar with the top surface of the gate structures 220*a*-220*e*.

After the planarization process is performed, some of the gate structures, for example gate structures 220*b* and 220*d*, may be removed to provide a trench that is to be filled with the metal gate material. The remaining gate structures 220*a*, 220*c* and 220*e*, which contain polysilicon, may serve as dummy gates. The gate structures 220*b* and 220*d* may be removed using any suitable removal process. For example, the sacrificial layer 216 and the gate dielectric layer 214 of the gate structures 220*b* and 220*d* may be removed subsequently using a dry etching process and/or a wet etching process.

Figure 2M:
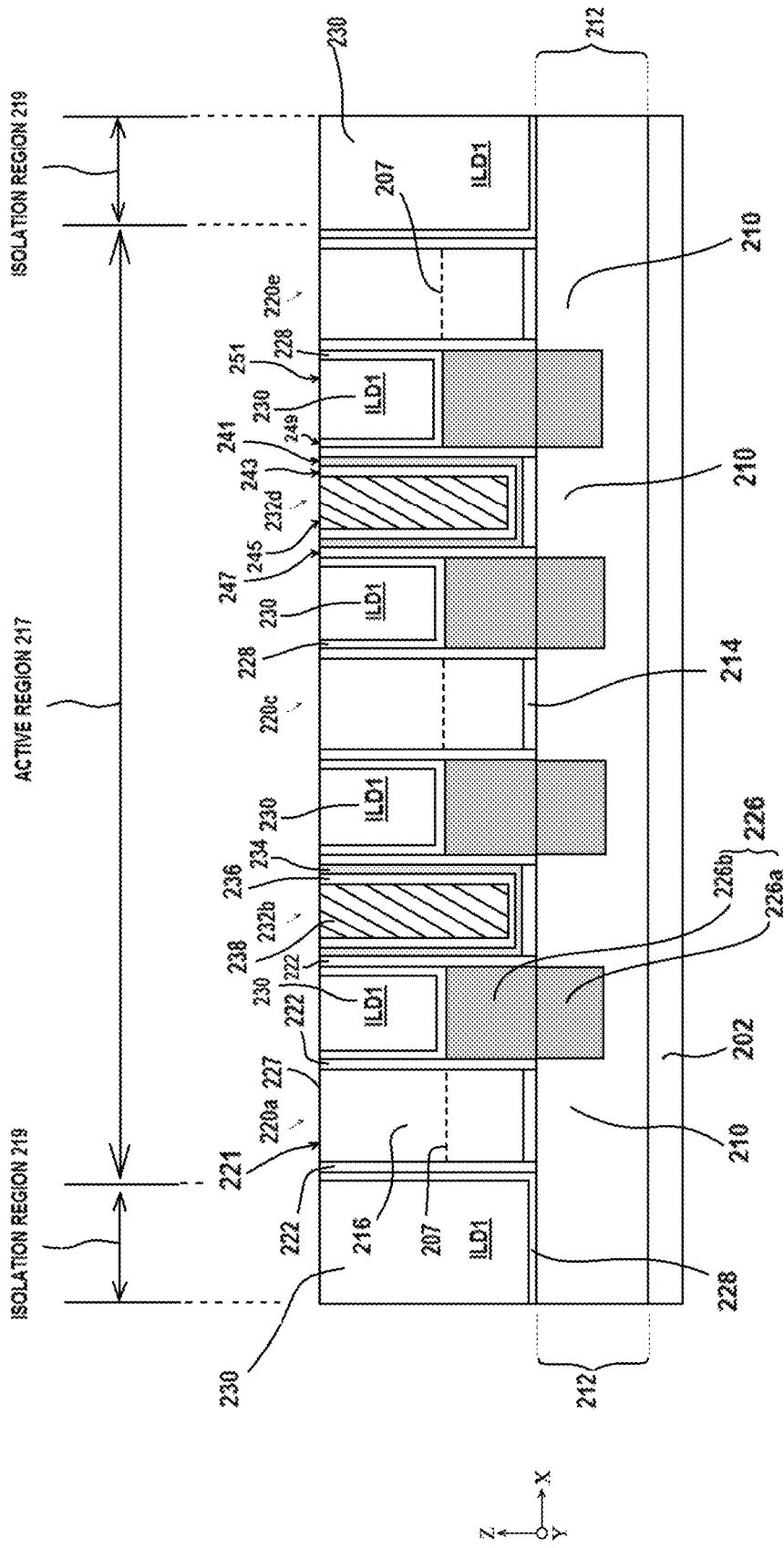

After the gate structures 220*b* and 220*d* have been removed, the trenches that are formed as a result of the removal of gate structures 220*b* and 220*d* as shown in FIG. 2L are filled with metal gate materials and form metal gates 232*b* and 232*d*, as shown in FIG. 2M. In some embodiments, the metal gates 232*b* and 232*d* may each include a high-k dielectric layer 234, a work function layer 236, and a metal gate electrode layer 238.

After the metal gates 232*b* and 232*d* have been formed, the excessive materials are removed using a planarization process, such as a chemical mechanical polishing (CMP) process, to expose a top surface 241 of the high-k dielectric layer 234, a top surface 243 of the work function layer 236, a top surface 245 of the metal gate electrode layer 238, a top surface 247 of the spacers 222, a top surface 249 of the contact etch stop layer 228, and a top surface 251 of the first inter-layer dielectric layer 230, as shown in FIG. 2M. The top surface 241 of the high-k dielectric layer 234, the top surface 243 of the work function layer 236, the top surface 245 of the metal gate electrode layer 238, the top surface 247 of the spacers 222, the top surface 249 of the contact etch stop layer 228, and the top surface 251 of the first inter-layer dielectric layer 230 are substantially co-planar.

In some embodiments, the high-k dielectric layer 234 is conformally formed on exposed surfaces of the trenches. The high-k dielectric layer 234 may be made of metal oxides, metal nitrides, metal silicates, transition metal-oxides, transition metal-nitrides, transition metal-silicates, or oxynitrides of metals. Examples of the high-k dielectric material may include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), silicon nitride, silicon oxynitride, zirconium oxide, titanium oxide, aluminum oxide, hafnium dioxide-alumina ($HfO_2$—$Al_2O_3$) alloy, or other suitable high-k dielectric material that has a dielectric constant of above about 3.9, and/or combinations thereof. Depending upon the material to be formed, a suitable process, such as atomic layer deposition (ALD) techniques, chemical vapor deposition (CVD) techniques, plasma enhanced chemical vapor deposition (PECVD) techniques, physical vapor deposition (PVD) techniques, or combinations thereof, may be used to form the gate dielectric.

In some embodiments, the work function layer 236 is conformally formed over the high-k dielectric layer 234. The work function metal layer 236 may be tuned to have a proper work function. For example, if a P-type work function metal (P-metal) for a PMOS device is desired, P-type work function materials may be used. Examples of P-type work function materials may include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other applicable materials.

On the other hand, if an N-type work function metal (N-metal) for NMOS devices is desired, N-type metal materials may be used. Examples of N-type work function materials may include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other applicable materials.

In some embodiments, the metal gate electrode layer 238 is formed over the work function layer 236. In some embodiments, the metal gate electrode layer 238 may be made of a conductive material, such as aluminum (Al), copper (Cu), titanium (Ti), tantalum (Ta), titanium aluminum (AlTi), titanium aluminum nitride (TiAlN), titanium (Ti), titanium nitride (TiN), tantalum nitride (TaN), tantalum silicon nitride (TaSiN), tantalum aluminum (AlTa), tantalum (Ta), nickel silicide, cobalt silicide, TaC, titanium silicon nitride (TaSiN), tungsten (W), tungsten nitride (WN), molybdenum nitride (MoN), platinum (Pt), ruthenium (Ru), other suitable conductive materials, and a combination thereof. Depending upon the material of the layer to be formed, a suitable process, such as chemical vapor deposition (CVD) techniques, physical vapor deposition (PVD or sputtering) techniques, atomic layer deposition (ALD) techniques, plasma enhanced chemical vapor deposition (PECVD) techniques, and/or plating, may be used to form the metal gate electrode layer 238.

Figure 2N:
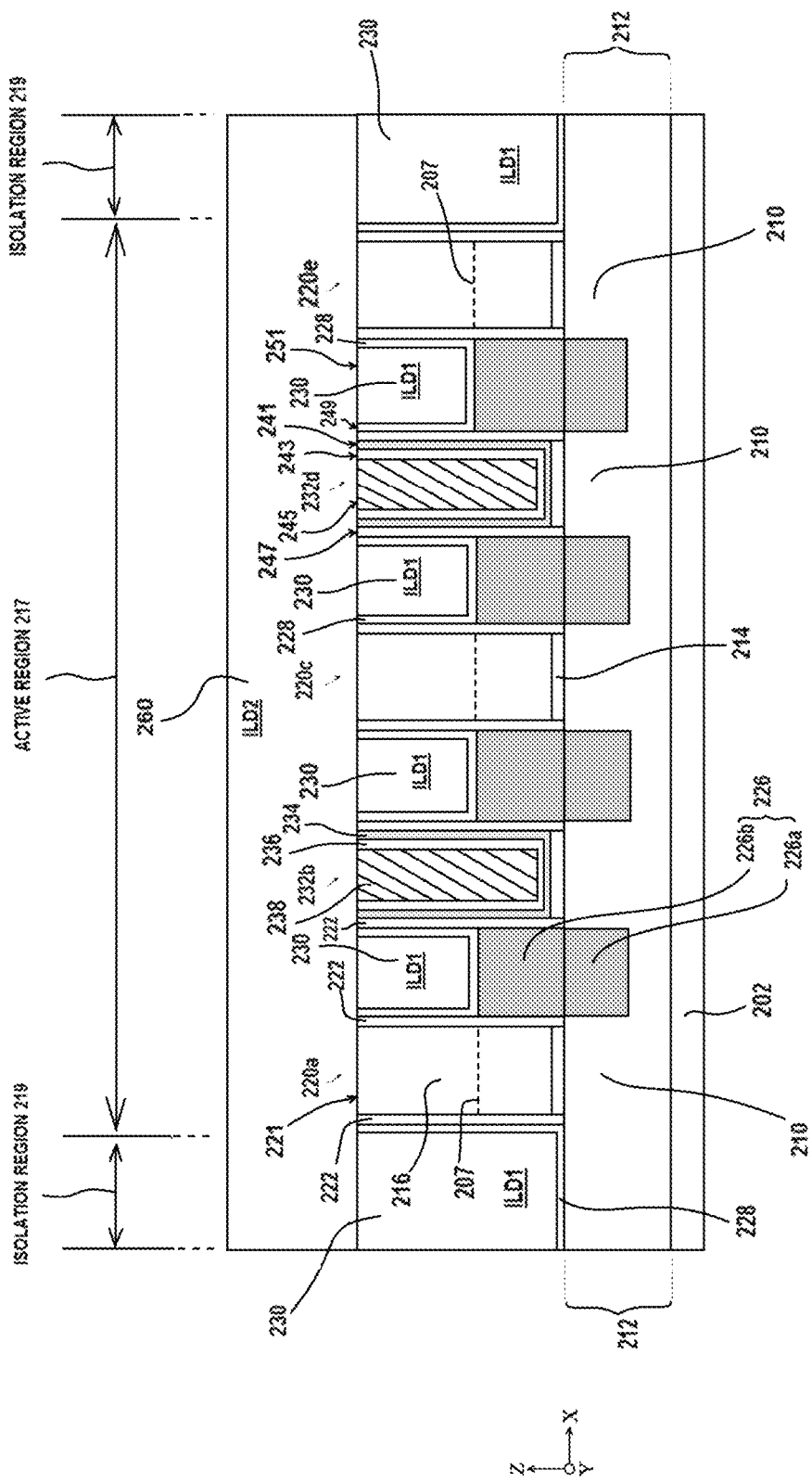

Thereafter, a second inter-layer dielectric (labeled as ILD2) layer 260 is formed to cover exposed top surfaces of the structure, i.e., the top surface 241 of the high-k dielectric layer 234, the top surface 243 of the work function layer 236, the top surface 245 of the metal gate electrode layer 238, the top surface 247 of the spacers 222, the top surface 249 of the contact etch stop layer 228, and the top surface 251 of the first inter-layer dielectric layer 230, as shown in FIG. 2N. The second inter-layer dielectric layer 260 can be seen to laterally cross the active region 217 and the isolation region 219 (FIG. 2P). The second inter-layer dielectric layer 260 may be made of the same or different material from the first inter-layer dielectric layer 230 depending upon the application.

Figure 2O:
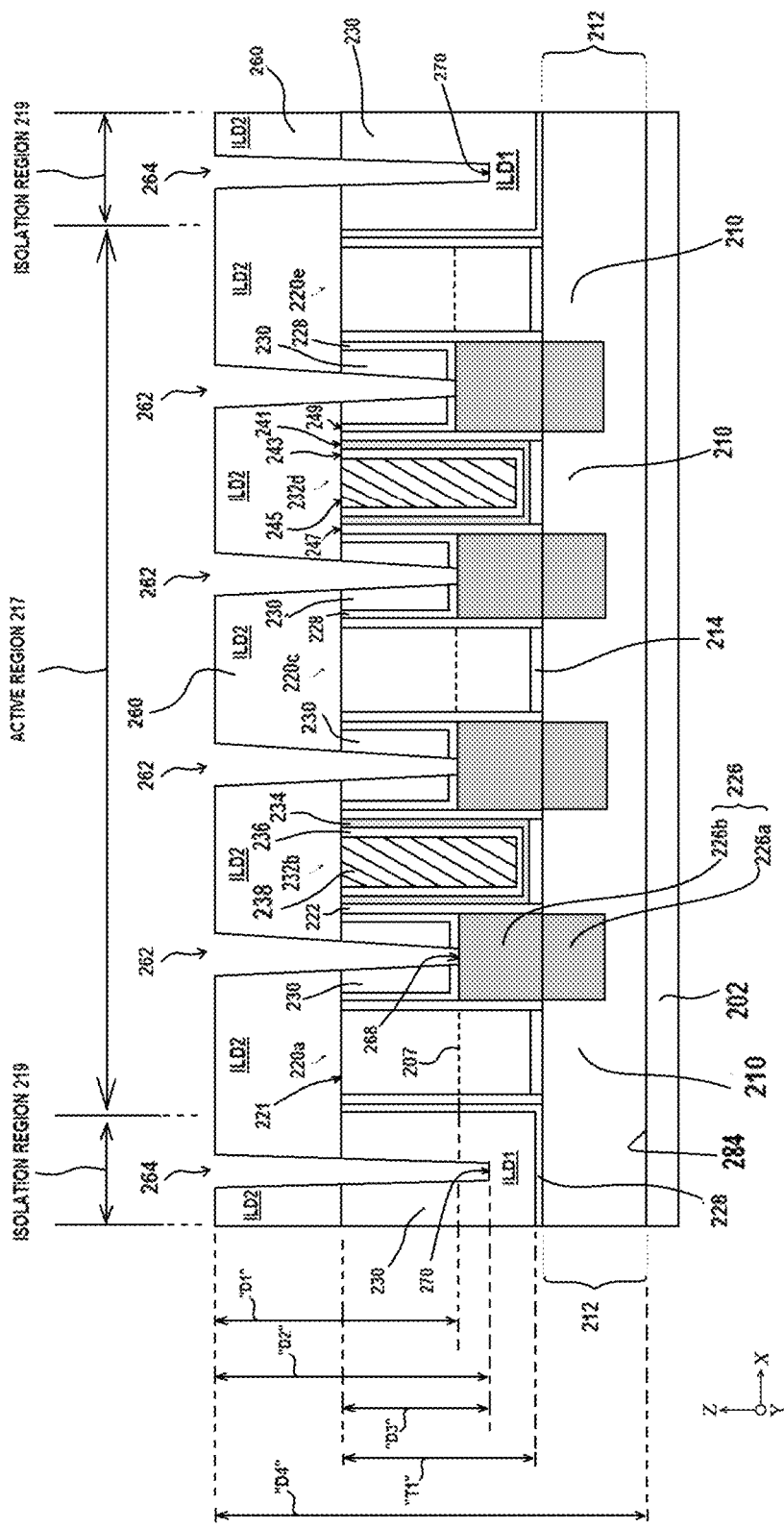
Figure 2P:
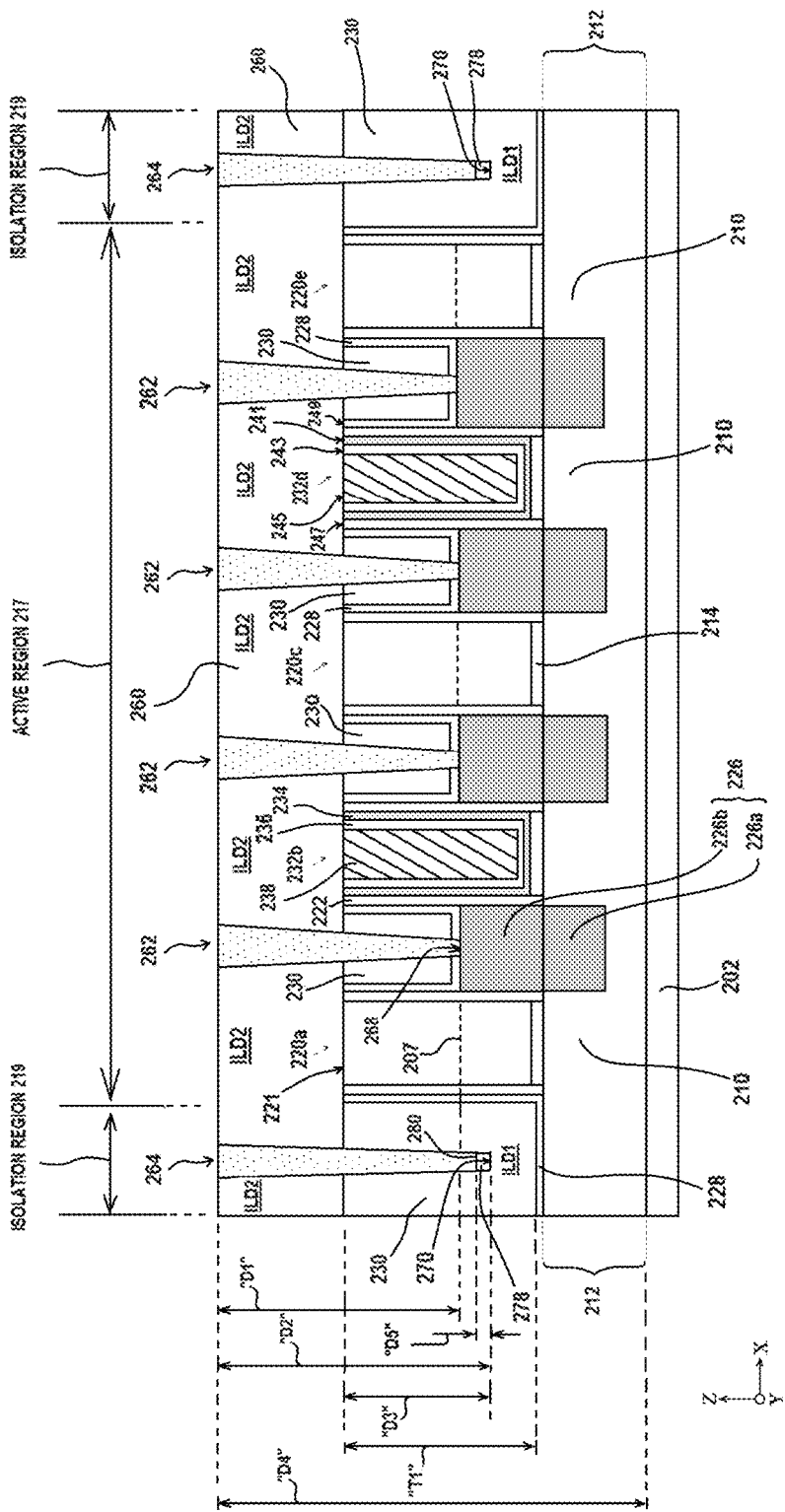

At operation 104, after the second inter-layer dielectric layer 260 has been formed, the substrate 202 is subjected to an etching process to simultaneously form first contact trenches 262 and second contact trenches 264 in the active region 217 and isolation region 219, respectively, as shown in FIG. 2O. The first contact trenches 262 are formed through the second inter-layer dielectric layer 260, the first inter-layer dielectric layer 230, and the contact etch stop layer 228 to expose a portion of the S/D structures 226. Likewise, the second contact trenches 264 are formed through the second inter-layer dielectric layer 260 and partially into the first inter-layer dielectric layer 230. The terms "trench" used herein may broadly cover any topographic features such as "opening," "holes," "channels," "recesses," "plugs," etc., that are suitable for providing a conductive or contact path which extend horizontally and/or vertically within the structure.

The first contact trenches 262 and the second contact trenches 264 are then filled with an electrical conductive material (to be discussed in more detail at operation 106 below). The first contact trenches 262 provide electrical contact with conductive channels/plugs to be subsequently formed over for inter-layer interconnect in a multi-layered semiconductor structure. The second contact trenches 264 may provide electrical connection between two neighboring MOS transistors, or provide electrical connection with electrical connecting structure (e.g., contact, via, local interconnect, etc.) to be subsequently formed over to couple the S/D structures 226 to an external voltage source and/or other inter-layer interconnect in a multi-layer semiconductor structure.

The first contact trenches 262 and the second contact trenches 264 can be formed by a lithography process and an etching process, such as a plasma dry etch process. During the lithography process, a patterned photoresist layer (not shown) is formed over the second inter-layer dielectric layer 260 with openings defining regions for the first contact trenches 262 and the second contact trenches 264. Portions of the second inter-layer dielectric layer 260, the first inter-layer dielectric layer 230, and the contact etch stop layer 228 are then removed, using the patterned photoresist layer as an etch mask layer, to form the first contact trenches 262 that expose a portion of the S/D structures 226. In the meantime, portions of the second inter-layer dielectric layer 260 and portions of the first inter-layer dielectric layer 230 are removed, using the patterned photoresist layer as an etch mask layer, to form the second contact trenches 264.

Upon completion of the etching process, the first contact trenches 262 are formed with a length or depth "D1" and the second contact trenches 264 are formed with a length or depth "D2". The depth "D1" is defined herein as a distance measured from a top surface 266 of the second inter-layer dielectric layer 260 to a bottom surface 268 of the first contact trenches 262. The depth "D2" is defined herein as a distance measured from the top surface 266 of the second inter-layer dielectric layer 260 to a bottom surface 270 of the second contact trenches 264. For a given time of etching, the depth "D2" is greater than the depth "D1". This is due to the different feature densities between the active region 217 and the isolation regions 219 (i.e., pattern-loading effects) and the presence of the contact etch stop layer 228 between the S/D structures 226, which results in a slower etching rate in the active region 217 than that of the isolation regions 219.

As will be discussed in more detail below, the inventors of the present disclosure have proposed an improved etching process to control the depth "D1" of the first contact trenches 262 and the depth "D2" of the second contact trenches 264.

Particularly, the etching process uses etchant gas mixtures that are optimized to effectively remove the contact etch stop layer 228 in the active region 217 at a faster rate than the materials of the isolation region 219. Since the active region 217 and the isolation region 219 are both exposed to the chemistry of the etching process simultaneously, the length of time required to etch the second contact trenches 264 through the second inter-layer dielectric layer 218 and the first inter-layer dielectric layer 230 in the isolation regions 219 in a given time frame is reduced. Accordingly, the depth "D2" of the second contact trenches 264 is reduced.

With this improved etching process, the depth "D2" of the second contact trenches 264 is shallower as compared to the conventional deeper contact trenches in the isolation region 219 that are formed by an etching process without using the improved etchant gas mixtures as an etchant. Shallower second contact trenches 264 are beneficial because they minimize distortion or bending of the trench profile along the depth of the second contact trenches 264 after the second contact trenches 264 are filled with a conductive material. When the second contact trenches 264 are shallower, the amount of the conductive material to be filled in the second contact trenches 264 is reduced. Since the second contact trenches 264 contain lesser amount of the conductive material, the shallower second contact trenches 264 do not get distorted or bent, and the integrity of the trench profile is thus preserved. Even if the second contact trenches 264 were distorted or bent, the second contact trenches 264 are prevented from contacting the adjacent structures (e.g., fin 210 under the gate structures 220a, 220e) due to its shallower profile. In contrast, deeper second contact trenches in the isolation region 219 are likely to bend and bridge with the adjacent structures, resulting in electrical shorting and therefore failure of the device. Using the improved etching process to be discussed below, the depth of the second contact trenches 264 in the isolation region 219 can be reduced by more than 12%, for example about 16% or more. In some examples, the depth of the second contact trenches 264 in the isolation region 219 is reduced by 25% or more, for example 37.5%.

In the embodiment depicted in FIG. 2O, the first inter-layer dielectric layer 230 has a thickness "T1" and the second contact trenches 264 extends into the first inter-layer dielectric 230 at a depth "D3". The thickness "T1" is defined herein as a distance measured from the top surface 251 of the first inter-layer dielectric layer 230 and a bottom surface 284 of the first inter-layer dielectric layer 230. The depth "D3" is defined herein as a distance measured from the top surface 251 of the first inter-layer dielectric layer 230 and the bottom surface 270 of the second contact trenches 264. In various embodiments, the depth "D3" and the thickness "T1" is at a ratio of about 1:1.1 to about 1:1.6, such as about 1:1.2 to about 1:1.5, for example about 1:1.3.

The first inter-layer dielectric layer 230, the second inter-layer dielectric layer 260 and the insulating layer 212 have a combined thickness or depth "D4". The depth "D4" is defined herein as a distance measured from the top surface 266 of the second inter-layer dielectric layer 260 to a bottom surface 284 of the insulating layer 212. In various embodiments, the depth "D2" of the second contact trenches 264 to the combined depth "D4" of first inter-layer dielectric layer 230 and the second inter-layer dielectric layer 260 is at a ratio of about 1:1.1 to about 1:1.6, such as about 1:1.2 to about 1:1.4, for example about 1:1.3.

The aspect ratio of the first contact trenches 262 may be about 2:1 to about 50:1, such as about 5:1 to about 30:1, for example about 20:1. The aspect ratio of the second contact trenches 264 may be about 2:1 to about 50:1, such as about 10:1 to about 30:1, for example about 20:1. The term "aspect ratio" herein refers to the ratio of the height dimension to the width dimension of a particular feature, for example, trench height to trench width of the first contact trenches 262 or second contact trenches 264. In various embodiments, the depth "D2" of the second contact trenches 264 to the depth "D1" of the first contact trenches 262 is at a ratio of about 1:0.3 to about 1:1, such as about 1:0.4 to about 1:0.9, for example about 1:0.7.

In some embodiments, the first contact trenches 262 and the second contact trenches 264 are formed with a substantially constant cross section from top to bottom. Shallower second contact trenches 264 with a substantially constant cross section profile allow them to fill with the electrical conductive material with controllable shrinkage of the conductive material and thus controllable air gap at the bottom of the second contact trenches 264 (will be discussed in more detail at operation 106).

In some embodiments, the first contact trenches 262 and/or second contact trenches 264 are formed with a slightly tapered cross section along the depth of the first contact trenches 262 and/or second contact trenches 264. That is, the trench width (or inner diameter) at the top of the first contact trenches 262 and/or second contact trenches 264 is slightly larger than the trench width at the bottom of the first contact trenches 262 and/or second contact trenches 264. This difference in trench width is partly due to the aspect ratio of the first contact trenches 262 and/or second contact trenches 264 being about 2:1 or greater. Therefore, the top portion of the first contact trenches 262 and/or second contact trenches 264 is exposed to the etchant for a longer period of time than the bottom portion of the first contact trenches 262 and/or second contact trenches 264, resulting in a wider trench width at the top portion and a narrower trench width at the bottom portion of the first contact trenches 262 and/or second contact trenches 264. In most cases, the trench width at the top of the first contact trenches 262 and/or second contact trenches 264 is at least 2% larger than the trench width at the bottom of the first contact trenches 262 and/or second contact trenches 264, such as about 5% or greater, about 10% or greater, about 20% or greater, about 30% or greater, or about 35% or greater.

The etching process may be a wet etch process or a dry etch process. In one embodiment, the etching process is a dry etch process, such as a plasma-based etch process. During the etching process, a patterned layer of photoresist may be disposed over the second inter-layer dielectric layer 260 so that the materials in the active region 217 and the isolation regions 219 not covered by the photoresist layer are simultaneously bombarded and removed with plasma species generated from one or more chemistries of the etching process. The plasma-based etch process may use capacitively coupled plasma or inductively coupled plasma. In some cases, the etching process may use neutral species such as radicals, which may be generated in a remote plasma system (RPS) that is separated from the process chamber where the substrate is placed. The term "species" described in this disclosure generally refer to ionized species, radical species, and/or neutral species that are found in a plasma.

Suitable chemistries for the etching process may include a fluorine-based chemistry, for example a fluorocarbon chemistry having the formula $C_xF_y$, wherein x and y is a positive integer, and/or hydrofluorocarbon chemistry having the formula $C_xH_yF_z$, wherein x, y, z is a positive integer. Examples of fluorocarbon chemistry may include, but are not limited to hexafluorobutadiene ($C_4F_6$), tetrafluoromethane ($CF_4$), hexafluoromethane ($C_2F_6$), octafluoropropane ($C_3F_8$), octafluorocyclobutane ($C_4F_8$), and any combination thereof. Examples of hydrofluorocarbon chemistry may include, but are not limited to trifluoromethane ($CHF_3$), difluoromethane ($CH_2F_2$), fluoromethane ($CH_3F$), tetrafluoroethane ($C_2H_2F_4$), trifluoroethane ($C_2H_3F_3$), and any combination thereof.

In some embodiments discussed herein, the etching process further includes a second gas including an inert gas, an oxygen-containing gas, or a combination thereof. Suitable inert gases may include, but are not limited to, helium (He), neon (Ne), argon (Ar), krypton (Kr), xenon (Xe), and any combination thereof. In one embodiment, the inert gas is argon. Suitable oxygen-containing gases may include, but are not limited to oxygen ($O_2$), ozone ($O_3$), carbon dioxide ($CO_2$), carbon monoxide (CO), and any combination thereof. In one embodiment, the oxygen-containing gas is oxygen.

In various embodiments of this disclosure, the fluorocarbon chemistry is flowed into a process chamber, such as a plasma etch chamber, at a first volumetric flowrate, and the hydrofluorocarbon chemistry is flowed into the process chamber at a second volumetric flowrate. A ratio of the first volumetric flowrate to the second volumetric flowrate can be controlled at about 5:1 to 40:1, such as about 10:1 to 25:1, for example 15:1 to 20:1. The oxygen-containing gas may be flowed into the process chamber at a third volumetric flowrate, and a ratio of the first volumetric flowrate to the third volumetric flowrate can be controlled at about 1:1 to 10:1, such as about 2:1 to 8:1, for example 4:1 to 6:1. The ratio of the second volumetric flowrate to the third volumetric flowrate can be controlled at about 1:1 to 1:8, such as about 1:2 to 1:6, for example 1:3 to 1:5. The inert gas may be flowed into the process chamber at a fourth volumetric flowrate, and a ratio of the first volumetric flowrate to the fourth volumetric flowrate can be controlled at about 1:10 to 1:200, such as about 1:15 to 1:60, for example 1:20 to 1:40. The ratio of the second volumetric flowrate to the fourth volumetric flowrate can be controlled at about 1:20 to 1:500, such as about 1:40 to 1:300, for example 1:60 to 1:250.

In one exemplary embodiment where the contact etch stop layer 228 is silicon nitride, the etching process uses an etchant gas mixture having $C_4F_6$, $O_2$, $CH_2F_2$, and Ar; an etchant gas mixture having $C_4F_8$, $O_2$, $CH_2F_2$, and Ar; an etchant gas mixture having $C_4F_6$, $O_2$, $CH_3F$, and Ar; or an etchant gas mixture having $C_4F_8$, $O_2$, $CH_3F$, and Ar.

In some embodiments, which may be combined with any embodiment of this disclosure, the etching process is a two-step plasma-based etching process where the first step uses fluorocarbon chemistry and the second step uses hydrofluorocarbon chemistry. Alternatively, the first step of the etching process uses hydrofluorocarbon chemistry and the second step uses fluorocarbon chemistry. In either case, the first step and/or the second step may further include a second gas including an inert gas, an oxygen-containing gas, or a combination thereof, as discussed above.

For example, a shallower profile of the S/D connection trenches 264 can be obtained using a two-step etching process involving a first step using an etchant gas mixture containing $C_4F_6$ and $O_2$, and a second step using an etchant gas mixture containing $CH_2F_2$ and Ar. In another embodiment, the etching process includes a first step using an etchant gas mixture comprising $C_4F_8$ and $O_2$, and a second step using an etchant gas mixture comprising $CH_2F_2$ and Ar. In one embodiment, the etching process includes a first step using an etchant gas mixture containing $C_4F_6$ and $O_2$, and a second step using an etchant gas mixture containing $CH_3F$ and Ar. In one embodiment, the etching process includes a first step using an etchant gas mixture containing $C_4F_8$ and $O_2$, and a second step using an etchant gas mixture containing $CH_3F$ and Ar.

During the etching process, the process chamber may be maintained at a chamber pressure of about 1 mTorr to about 300 mTorr, such as about 10 mTorr to about 80 mTorr, for example about 20 mTorr. The chamber temperature may be maintained at about 5 degrees Celsius to about 200 degrees Celsius, such as about 10 degrees Celsius to about 120 degrees Celsius, for example about 20 degrees Celsius to about 60 degrees Celsius. The RF power used to generate plasma may be applied between about 50 watts to about 3000 watts, for example about 100 watts to about 1000 watts, and at a radio frequency of about 50 kHz to about 150 MHz, for example about 400 kHz to about 60 MHz. The etching process may be timed to achieve the desired depth of the trenches in the active region 217 and the isolation regions 219. For example, the depth "D2" of the S/D connection trenches 264 and the depth "D1" of the first contact trenches 262 may be controlled by adjusting the length of time the substrate is exposed to the etching chemistries during the etching process. In one embodiment, the etching process is performed for about 10 seconds to about 15 minutes, such as about 20 seconds to about 5 minutes, for example about 30 seconds to about 1 minute. It is understood that the etching time may vary depending upon the depth needed as long as the depth "D2" of the second contact trenches 264 to the combined depth "D3" of first inter-layer dielectric layer 230 and the second inter-layer dielectric layer 260 is at a ratio of about 1:1.2 to about 1:1.7, such as about 1:1.3 to about 1:1.6, for example about 1:1.5. The process parameters discussed herein are based on a 300 mm diameter substrate.

At operation 106, after the first contact trenches 262 and the second contact trenches 264 are formed with a desired depth in the active region 217 and the isolation regions 219, respectively, the first contact trenches 262 and the second contact trenches 264 are filled with an electrical conductive material 276 and then planarized to expose the top surface 266 of the second inter-layer dielectric layer 260, as shown in FIG. 2P in accordance with some embodiments. The second contact trenches 264 therefore provide electrical connection between two neighboring MOS transistors, or provide electrical connection with electrical connecting structure (e.g., contact, via, local interconnect, etc.) to be subsequently formed over to couple the S/D structures 226 to an external voltage source and/or other inter-layer interconnect in a multi-layer semiconductor structure. On the other hand, the first contact trenches 262 provide electrical contact with conductive channels/plugs to be subsequently formed over for inter-layer interconnect in a multi-layered semiconductor structure.

Suitable materials for the electrical conductive material 276 may include, but are not limited to cobalt, copper, ruthenium, palladium, platinum, nickel, ruthenium oxide, tungsten, aluminum, titanium, tantalum, hafnium zirconium, metal carbide, a conductive metal oxide, and any combination thereof. In one embodiment, the electrical conductive material 276 is cobalt. The first contact trenches 262 and second contact trenches 264 may be filled using any suitable technique, such as a PVD, electroplating, chemical vapor deposition (CVD), plasma-enhanced CVD (PECVD), pulsed-CVD, ALD, PE-ALD, or combinations thereof.

In some embodiments, an air gap 278 is formed in the second contact trenches 264 between the bottom 280 of the electrical conductive material 276 and the bottom surface 270 of the second contact trenches 264. The air gap 278 is formed partly due to shrinkage in volume of the electrical conductive material 276 upon cooling to room temperature. On the other hand, the first contact trenches 262 in the active region 217 may not have air gap because the first contact trenches 262 in the active region 217 are shallower than the second contact trenches 264 in the isolation region 219. Since the second contact trenches 264 are deeper, it is not easy for the electrical conductive material 276 to reach the bottom of the second contact trenches 264 in a given time frame as it would to the bottom of the first contact trenches 262. As a result, the air gap 278 is more likely to form at the bottom of in the second contact trenches 264.

It has been observed by the present inventors that the air gap 278 can help prevent the second contact trenches 264, when distorted or bent, from electrically shorting with the adjacent structures (e.g., fin 210 under the gate structure 272a or 272e. The air gap 278 is beneficial in some applications as it prevents or minimizes the parasitic capacitance between the second contact trenches 264 and the adjacent structures.

In some embodiments, after the second contact trenches 264 are filled with the electrically conductive material 276, the substrate 200 may be subjected to a thermal treatment, such as a reflow process or an annealing process, to control the size of the air gap 278. The size of the air gap 278 can be adjusted by controlling the reflow temperature of the electrical conductive material. In cases where the electrical conductive material 276 is cobalt, a deposition process may be performed to fill the second contact trenches 264 with cobalt. The substrate 202 is then cooled to a first temperature range, which may be between room temperature and a temperature that is below the reflow temperature of the cobalt, to form an air gap 278 at the bottom of the second contact trenches 264. Thereafter, the substrate 202 may be gradually heated to a second temperature range approaching or above the reflow temperature (e.g., about 200 degrees Celsius to about 500 degrees Celsius) to reflow the cobalt within the second contact trenches 264. Reflowing of the cobalt within the second contact trenches 264 changes the size of the air gap 278 at the bottom of the second contact trenches 264.

As shown in FIG. 2P, the air gap 278 has a length or depth "D5" defined as a distance measuring from the bottom 280 of the filled electrical conductive material 276 to the bottom surface 270 of the second contact trenches 264. In various embodiments, the depth "D5" of the air gap 278 to the depth "D2" of the second contact trenches 264 is at a ratio of about 1:3 to about 1:40, such as about 1:4 to about 1:20, for example about 1:5 to about 1:10.

After the first contact trenches 262 and the second contact trenches 264 are filled with the electrical conductive material 276, the substrate 202 may be subjected to additional processes, such as a metallization process which may be required to make a multi-level interconnect structure.

Embodiments of the present disclosure use an improved etching process to form a first contact trench at an active region of the substrate and a second contact trench at an isolation region surrounding the active region by simultaneously exposing the substrate to plasma species formed from a fluorocarbon chemistry, a hydrofluorocarbon chemistry, an oxide-containing gas, and an inert gas. The plasma species allow the first contact trench to form through a dielectric layer and an etch stop layer and expose a portion of the source/drain contact at a faster rate than the materials of the isolation region, resulting in a reduced depth of the second contact trench as compared to the conventional deeper contact trenches at the isolation region that are formed by an etching process without using the improved process. The second contact trench with the reduced depth minimizes distortion or bending of the trench profile along the depth of the second contact trench upon filling of conductive material. Shallower trench profile of the second contact trench also prevents the second contact trench from contacting the adjacent gate structures even if the second contact trench were distorted or bent. In some embodiments, the second contact trench may have an air gap formed at the bottom of the second contact trench to prevent the second contact trench from electrically shorting with the adjacent gate structures. As a result, the parasitic capacitance between the second contact trench and the adjacent gate structures is prevented or minimized.

In one embodiment, a semiconductor device includes a substrate, an insulating layer formed over the substrate, a plurality of fins formed vertically from a surface of the substrate, the plurality of fins extending through the insulating layer and above a top surface of the insulating layer, a gate structure formed over a portion of fins and over the top surface of the insulating layer, a source/drain structure disposed adjacent to opposing sides of the gate structure, the source/drain structure contacting a portion of the fin, a dielectric layer formed over the insulating layer, a first contact trench extending a first depth through the dielectric layer to expose the source/drain structure, the first contact trench containing an electrical conductive material, and a second contact trench extending a second depth into the dielectric layer, the second contact trench containing the electrical conductive material, and the second depth is greater than the first depth.

In another embodiment, a semiconductor device includes a substrate, a fin formed vertically from a surface of the substrate, an insulating layer formed over the substrate, the insulating layer covering both sides of a bottom portion of the fin, a gate structure formed over the fin and over the insulating layer, a source/drain structure disposed on opposing sides of the gate structure, the source/drain structure contacting a top portion of the fin, a first dielectric layer having a first portion formed over the insulating layer and a second portion formed over the source/drain structure, a top surface of the first dielectric layer and a top surface of the gate structure are substantially co-planar, a second dielectric layer formed over the first dielectric layer, a first contact trench extending through the second dielectric layer and the second portion of the first dielectric layer to expose a portion of the source/drain structure, the first contact trench containing an electrical conductive material, and a second contact trench extending through the second dielectric layer and a depth into the first portion of the first dielectric layer, the second contact trench being partially filled with the electrical conductive material to provide an air gap between the electrical conductive material and a bottom surface of the second contact trench.

In yet another embodiment, a method of manufacturing a semiconductor device includes forming an insulating layer formed over a substrate, forming a plurality of fins from a surface of the substrate, the plurality of fins extending vertically through the insulating layer and above a top surface of the insulating layer, forming a gate structure over a portion of fins and over the top surface of the insulating layer, forming a source/drain structure at opposing sides of the gate structure, the source/drain structure contacting a portion of the fin, forming an etch stop layer over the source/drain region, forming a dielectric layer over the insulating layer, forming a first contact trench through the dielectric layer and the etch stop layer to expose the source/drain structure, forming a second contact trench into a depth of the dielectric layer, wherein the first and second contact trenches are formed by simultaneously exposing the substrate to plasma species formed from a fluorocarbon chemistry, a hydrofluorocarbon chemistry, an oxide-containing gas, and an inert gas, and filling the first and second contact trenches with an electrical conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method comprising:
   forming a source/drain feature over a substrate;
   forming an interlayer dielectric layer over the source/drain feature;
   etching the interlayer dielectric layer to form a first trench extending to a first depth within the interlayer dielectric layer and etching the interlayer dielectric layer to form a second trench extending to the source/drain feature;
   forming a conductive material within the first trench and the second trench, wherein the conductive material interfaces with a bottommost surface of the first trench defined by the interlayer dielectric layer and interfaces with the source/drain feature in the second trench;
   cooling the conductive material in the first trench, wherein the cooling of the conductive material in the first trench shrinks the conductive material such that the conductive material moves away from the bottom surface of the interlayer dielectric layer thereby forming an air gap of a first size; and
   after the cooling of the conductive material in the first trench, performing a reflow process on the conductive material in the first trench to move the conductive material thereby altering the air gap to have a second size that is different than the first size.

2. The method of claim 1, wherein the conductive material includes cobalt,
   wherein the cooling of the conductive material in the first trench includes cooling the conductive material to a first temperature ranging from room temperature to less than a reflow temperature of cobalt, and
   wherein the performing of the reflow process on the conductive material in the first trench includes heating the conductive material to a second temperature ranging from about 200° C. to about 500° C.

3. The method of claim 1, wherein the etching of the interlayer dielectric layer to form the first trench and the etching of the interlayer dielectric layer to form the second trench occurs simultaneously.

4. The method of claim 1, wherein the etching of the interlayer dielectric layer to form the first trench and the etching of the interlayer dielectric layer to form the second trench includes performing a plasma-based etching process that includes exposing the interlayer dielectric layer to plasma species formed from a fluorocarbon chemistry, a hydrofluorocarbon chemistry, an oxygen-containing gas, and an inert gas.

5. The method of claim 4, wherein the fluorocarbon chemistry has the formula $C_xF_y$, wherein x and y is a positive integer, and
   wherein the hydrofluorocarbon chemistry has the formula $C_xH_yF_z$, wherein x, y, z is a positive integer,
   wherein the oxygen-containing gas is selected from the group consisting of oxygen, ozone, carbon dioxide, carbon monoxide and any combination thereof, and
   wherein the inert gas includes is selected from the group consisting helium, neon, argon, krypton, xenon and any combination thereof.

6. The method of claim 4, wherein the fluorocarbon chemistry is flowed into a process chamber in which the device is disposed at a first volumetric flowrate, the hydrofluorocarbon chemistry is flowed into the process chamber at a second volumetric flowrate, the oxygen-containing gas is flowed into the process chamber at a third volumetric flowrate, and the inert gas is flowed in the process chamber at a fourth volumetric flowrate
   wherein a ratio of the first volumetric flowrate to the second volumetric flowrate is at about 5:1 to about 40:1,
   wherein a ratio of the first volumetric flowrate to the third volumetric flowrate is at about 1:1 to about 10:1, and
   wherein a ratio of the first volumetric flowrate to the fourth volumetric flowrate is at about 1:10 to about 1:200.

7. The method of claim 6, wherein during the etching of the interlayer dielectric layer to form the first trench and the etching of the interlayer dielectric layer to form the second trench includes:
   maintaining a pressure of the process chamber between about 1 mTorr to about 300 mTorr;
   maintaining a temperature of the process chamber between about 5° C. to about 200° C.; and
   applying a radio frequency power used to generate the plasma species between about 50 watts to about 3000 watts.

8. A method comprising:
   forming a fin structure over a substrate, wherein the fin structure extends through a dielectric isolation feature;
   epitaxially growing a source/drain feature on a first portion of the fin structure;
   forming a first interlayer dielectric layer over the source/drain feature and the dielectric isolation feature;
   etching the first interlayer dielectric layer to form a first trench extending to a first depth within the first interlayer dielectric layer and etching the second interlayer dielectric layer to form a second trench extending to the source/drain feature;
   forming a conductive material within the first trench and the second trench, wherein the conductive material interfaces with a bottommost surface of the first trench defined by the interlayer dielectric layer and interfaces with the source/drain feature in the second trench; and
   performing a first treatment process on the conductive material in the first trench such that the conductive material moves away from the bottommost surface of the first trench thereby forming an air gap having a first size; and
   performing a second treatment process on the conductive material in the first trench such that the conductive material moves within the first trench thereby altering the air gap to have a second size that is different than the first size.

9. The method of claim 8, wherein after the performing of the first treatment process, the air gap extends from the bottommost surface of the first trench to a bottommost surface of the conductive material disposed within the first trench.

10. The method of claim 8, further comprising:
forming a first gate structure over a second portion of the fin, wherein forming the first interlayer dielectric layer over the source/drain feature includes forming the first interlayer dielectric layer over the first gate structure;
removing a portion of the first interlayer dielectric layer to expose the first gate structure;
removing the first gate structure to form a gate trench;
forming a second gate structure in the gate trench;
forming a second interlayer dielectric layer over the first interlayer dielectric layer and the second gate structure, and wherein etching the first interlayer dielectric layer to form the first trench and etching the second interlayer dielectric layer to form the second trench includes etching the second interlayer dielectric layer.

11. The method of claim 8, wherein the etching of the first interlayer dielectric layer to form the first trench and the etching of the first interlayer dielectric layer to form the second trench includes:
applying a first plasma species formed from fluorocarbon chemistry and an oxygen-containing gas, wherein the fluorocarbon chemistry has the formula $C_xF_y$, wherein x and y is a positive integer; and
applying a second plasma species formed from hydrofluorocarbon chemistry and an inert gas, wherein the hydrofluorocarbon chemistry has the formula $C_xH_yF_z$, wherein x, y, z is a positive integer.

12. The method of claim 11, wherein the first plasma species is applied before the applying of the second plasma species, and
wherein the oxygen-containing gas is selected from the group consisting of: oxygen, ozone, carbon dioxide, carbon monoxide and any combination thereof, and
wherein the inert gas includes is selected from the group consisting helium, neon, argon, krypton, xenon and any combination thereof.

13. The method of claim 8, further comprising recessing the fin structure, and wherein epitaxially growing the source/drain feature on the first portion of the fin structure includes epitaxially growing the source/drain feature on the recessed fin structure that includes the first portion.

14. A method comprising:
epitaxially growing a source/drain feature over a substrate;
forming a dielectric layer over the source/drain feature;
etching the dielectric layer to form a first trench extending to a first depth within the dielectric layer and etching the dielectric layer to form a second trench extending to the source/drain feature;
forming a conductive material within the first trench and the second trench, wherein the conductive material interfaces with a bottommost surface of the first trench defined by the dielectric layer;
performing a first treatment process on the conductive material in the first trench such that the conductive material moves away from the bottommost surface of the first trench thereby forming an air gap extending a first distance from the bottommost surface of the first trench to the bottommost surface of the conductive material disposed in the first trench; and
performing a second treatment process on the conductive material in the first trench such that the conductive material moves within the first trench thereby altering the air gap, the altered gap extending a second distance from the bottommost surface of the first trench to the bottommost surface of the conductive material disposed in the first trench, the second distance being different than the first distance.

15. The method of claim 14, wherein the etching of the dielectric layer to form the first trench and the etching of the dielectric layer to form the second trench includes using an etchant gas mixture selected from the group consisting of:
a first mixture having $C_4F_6$, $O_2$, $CH_2F_2$ and Ar;
a second mixture having $C_4F_8$, $O_2$, $CH_2F_2$ and Ar;
a third mixture having $C_4F_6$, $O_2$, $CH_3F$ and Ar; and
a fourth mixture having $C_4F_8$, $O_2$, $CH_3F$ and Ar.

16. The method of claim 14, wherein the performing of the first treatment process includes applying a cooling process on the conductive material in the first trench, and
wherein the performing of the second treatment process includes applying a heating process on the conductive material in the first trench, and
wherein the conductive material includes a material selected from the group consisting of cobalt, copper, ruthenium, palladium, platinum, nickel, ruthenium oxide, tungsten, aluminum, titanium, tantalum, hafnium zirconium, metal carbide, a conductive metal oxide and any combination thereof.

17. The method of claim 14, further comprising forming a contact etch stop layer on the source/drain feature, and
wherein the etching of the dielectric layer to form the second trench extending to the source/drain feature includes etching through the contact etch stop layer.

18. The method of claim 1, wherein a ratio of a depth of the first trench to a depth of the second trench is about 1:0.4 to about 1:0.9.

19. The method of claim 18, wherein the first trench has a substantially constant first cross section profile, and
wherein the second trench has a substantially constant second cross section profile.

20. The method of claim 18, wherein the first trench is wider in an upper portion than a bottom portion of the first trench, and
wherein the second trench is wider in an upper portion than a bottom portion of the second trench.

* * * * *